United States Patent [19]

Fruhauf

[11] 3,798,637

[45] Mar. 19, 1974

[54] PCM CODER WITH COMPRESSION CHARACTERISTIC

[75] Inventor: Waldemar Fruhauf, Berlin, Germany

[73] Assignee: Krone GmbH, Berlin-Zehlendorf, Germany

[22] Filed: June 12, 1972

[21] Appl. No.: 261,690

Related U.S. Application Data

[63] Continuation-in-part of Ser. No. 120,171, March 2, 1971, Pat. No. 3,688,221.

[30] Foreign Application Priority Data

June 14, 1971 Germany........................... 2129383

[52] U.S. Cl... 340/347 AD, 340/15.5 GC, 325/38 R

[51] Int. Cl. .......................................... H03k 13/02

[58] Field of Search ............. 340/347 AD, 15.5 GC; 325/38 R, 38 A, 38 B; 324/99 D

[56] References Cited

UNITED STATES PATENTS

| | | | |
|---|---|---|---|
| 3,133,278 | 5/1964 | Millis | 340/347 AD |
| 3,493,958 | 2/1970 | Gorbatenko et al. | 340/347 AD |
| 3,500,247 | 3/1970 | Sekimoto et al. | 340/347 AD X |
| 3,636,555 | 1/1972 | Waaben | 340/347 AD |
| 3,483,550 | 12/1969 | Max | 340/347 AD |
| 3,569,953 | 3/1971 | Shuda et al. | 340/347 AD |

OTHER PUBLICATIONS

Crosier, IBM Technical Disclosure Bulletin, Vol. 11, No. 1 June 1968, pg. 4–5

*Primary Examiner*—Charles D. Miller
*Attorney, Agent, or Firm*—Karl F. Ross; Herbert Dubno

[57] ABSTRACT

Analog signals within a predetermined amplitude range are subjected, in a first amplifier stage, to parallel amplification with a relatively low gain (e.g. unity) and with a relatively high gain (e.g. 16:1) and are simultaneously rectified to have a single polarity (e.g. positive); the voltages on the four output leads of this stage are fed in parallel to a first analog/digital converter and, via a second amplifier stage, to a second analog/digital converter for temporary storage in a first and a second binary register, respectively. The first converter, which together with the first register forms part of a precoder, operates according to a reflected code (Gray code) to generate a sign bit, indicating the polarity of the incoming analog signal, and a group of $m$ higher-order bits (e.g. $m=3$) specifying $2m$ positive or negative amplitude bands; these $m+1$ bits are delivered to a logic network which controls the operation of a selector switch unblocking one of the output leads of the first amplifier stage and which also modifies the gain of the second amplifier stage to make the voltage swing in its output identical for all $2m$ bands of either polarity. The second converter, also operating in a reflected code, generates a group of $n$ lower-order bits (e.g. $n=4$) giving the amplitude increments or quanta within each band. The contents of both registers may be read out through further code converters translating the reflected code into the natural binary code. The selector switch normally grounds the input of the second amplifier stage to which the output voltage of the first amplifier stage is transmitted with a delay matching the interval between a writing pulse for the first register and a similar pulse for the second register; the latter pulse restores the selector switch to normal after a limited transfer period.

20 Claims, 19 Drawing Figures

PCM CODER WITH COMPRESSION CHARACTERISTIC

This application is a continuation-in-part of my copending application Ser. No. 120,171 filed 2 Mar. 1971, now U.S. Pat. No. 3,688,221.

My present invention relates to a pulse-code-modulation system of the compander type and, more particularly, to a modulator for such a system having a knee-type compression characteristic to modify the dynamics of a signal voltage to be coded.

Such a compression characteristic consists of $2^{m+1}$ linear segments of progressively diminishing slope dividing a range of signal amplitudes, between limits of $\pm U_{max}$, into $2^{m+1}$ bands (half of them positive, half of them negative) whose width increases from the origin outward by a factor of 2, except for the two innermost bands on either side of the abscissa which are of the same width. With the slope of the segments decreasing in the same binary ratio, the output-voltage increment measured by each segment along the ordinate has the same constant value $\Delta U$.

More particularly, and as discussed hereinafter by way of example, such a characteristic may be divided into 16 segments (eight on each side of the origin) so that $m = 3$. If the four innermost segments of identical slope are considered a single segment, the number of segments reduces to 13.

Thus, the segments of such a characteristic can be defined by a total of m+l bits, the first bit serving to distinguish between its positive and its negative branches and being therefore necessary only if the signal voltage to be coded can be of either polarity. Within each segment of the characteristic, the amplitude band further divided into $2^n$ sub-bands represented by $n$ bits so that the sampled signal amplitudes within the range can be digitized by an $(m+l+n)$-bit code for a total of $2^{m+1+n}$ discrete values. Generally, the minimum value of $n$ equals 4; in a limiting case, $n$ could be as low as 1.

Thus, such an analog signal can be digitized with the aid of two coding stages, i.e. a precoder generating $m$ bits and a final coder generating $n$ bits, with the polarity bit (if any) produced either by a zero comparator or by the precoder itself. In order to obtain the desired compression characteristic, an amplitude converter is used which introduces an amplification factor depending upon the absolute magnitude of the analog signal to be coded.

In conventional PCM systems of this general type it is customary to place the amplitude converter ahead of both coding stages whereby the classification of the signal amplitude, as falling within a particular band, must be carried out by the converter itself. For this purpose the converter includes a switching matrix controlled by a decision network which discriminates between the various signal amplitudes to select one of several converter outputs for coding. The decision network, responding to the voltage swing in the converter output, effectively forms with the switching matrix a feedback loop which is incapable of detecting and correcting a wrong classification once made, due to a possible overshot. As a result, coding errors may presist for considerable periods, i.e. until the input signal shifts to a different amplitude band.

In my above-identified application and patent I have disclosed and claimed an improved pulse-code modulator for the type of system referred to that avoids the aforestated drawbacks and obviates the need in such a modulator for so-called floating analog switches (which do not respond to a fixed reference potential) as well as constant-current generators, both of which require complex circuitry in order to be realized with the necessary degree of precision. This improved modulator reduces the conventionally required amplification of the input signal which in known systems must provide a maximum of 512V if the final coder operates in a range of 0 to 4V. Such high voltages are difficult to realized in switching cycles on the order of 1$\mu$sec as required for the PCM system of the 30/32-channel type in which only about 4$\mu$sec are available for the entire coding process, just a fraction of this time being allotted to amplitude conversion.

The modulator of my application includes a precoder which is controlled by the decision network independently of the amplitude converter, the latter working directly into the final coder while bypassing the precoder. The abosolute magnitude of the output voltage generated by the amplitude converter and fed to the final coder rises linearly from zero within each band, thus enabling the final coder to digitize that output voltage without regard to the location of the band in which it originated.

As further disclosed in my prior application, the signal voltage to be coded is periodically sampled by a train of pulses applied to an electronic switch, such as a field-effect transistor (FET), lying in the charging path of a storage capacitor. In order to compensate for the detrimental effect of the switching transients, resulting in the so-called dynamic zero offset, my prior system also includes an ancillary condenser feeding a balancing pulse to the storage capacitor. This solution, though entirely suitable in principle, complicates the circuitry involved and prevents its exclusive realization by integrated-circuit techniques.

Thus, my present invention aims at further improving the modulator disclosed in my prior application and, specifically, at obviating the need for such balancing circuitry.

Another object of this invention is to provide a simplified amplitude converter in a modulator of this type.

In accordance with my present invention, the amplitude converter is designed as a two-stage amplification unit of variable gain whose first stage is connected to the input of the system usually through a timer-controlled multiplexing unit TO receive the incoming analog voltage and to reduce its amplitude swing or dynamics. The first amplifier stage works into a precoder including a first analog/digital converter and an $m$-bit register in the output thereof, this register serving for the temporary storage of a first partial code (of $m$ bits, supplemented by a sign bit in the case of a bipolar input signal) which is fed to an associated decision network controlling the overall gain of the amplitude converter. The second amplifier stage works into the final coder whose $n$ bits, if read out in parallel (and, of course, if $n > 1$), can be temporarily stored as a second partial code in a second binary register forming part of the output circuit of this coder. The read-out of the two partial codes of $m$ (or $m + 1$) and $n$ bits, respectively, proceeds under the control of the timer which emits a recurrent writing pulse for the first ($m$-bit) register and also activates the output of the final coder in the same rhythm or frequency, as by emitting another writing pulse of the second ($n$-bit) register. The two writing pulses may be relatively staggered to compensate for the transit time of the signal voltages from the first to the second amplifier stage, particularly if the transfer between these stages is determined by a switching circuit controlled by the decision network to extend one of several output leads of the first stage to the input of the second stage. In fact, since the decision network may have a finite response time, these output leads could include ancillary delay means compensating therefor.

In a preferred embodiment described in detail hereinafter, the first amplifier stage comprises two parallel amplifiers of ratively low and relatively high gain, respectively. In a system designed for bipolar signal voltages, the output leads of these two parallel amplifiers are duplicated with interposition of a pair of analog inverters so that the first stage has a total of four such output leads whose energization provides information on both the order of magnitude and the polarity of the signal. It should be noted that this information is available regardless of the effective amplification factor selected for this stage, i.e. independently of which of these output leads is extended to the input of the second stage; thus, there is no risk of a sustained classification error.

Though the second amplifier stage could also consist of several parallel amplifiers of different gain with selectively switchable output leads, I prefer to design that stage as a single operational amplifier whose gain is adjustable in the manner discussed in my prior application, i.e. with the aid of a feedback circuit including a resistance matrix along with electronic switches for selectively disconnecting branches thereof from a common terminal. As explained in the prior application, the amplification factor of such an amplifier depends on the division ratio of a voltage divider having a tap connected to the inverting amplifier input; a biasing voltage may be applied to that inverting input through one of several parallel branches of different electrical weight (preferably the electrically least significant branch) in order to differentiate between the first two segments of the characteristic which have the same slope and therefore call for the same amplification factor.

The conversion of an analog voltage into a binary word, such as the first partial code of $m$ or $m+l$ bits generated by the precoder, may lead to ambiguities the analog/digital converter operates in the conventional manner, with e oof comparators, to establish the natural binary code; referce may be made in this connection to David F. Hoeschele, Jr., *Analog-to-Digital/Digital-to-Analog-Conversion Techniques*, John Wiley & Sons, Inc., New York, London, Sidney, 1968, pages 355 ff. Thus, a signal amplitude substantially coinciding with a knee point of the compression characteristic may be registered as being in either one or the other of two adjoining ranges and, if accompanied by super-imposed transients or high-frequency noise, could shift between these ranges during the response period of the comparators. Two amplitudes of numerical values 7 and 8, for example, are expressed in the natural binary code by the bit combinations 0111 and 1000, respectively, so that an incremental shift during the coding process could give rise to such divergent entries as 0000 and 1111. In order to eliminate this ambiquity, which upon audible reproduction manifests itself as a click or a crackle, I prefer to use a so-called reflected binary code in which only a single bit is changed with any incremental change. One such reflected or cyclic code, known as the Gray code, has the sequence 000
001
011
010
110
111
101
100 for the numerical values 0 through 7. If desired, each register storing such a code may be followed by a code converter translating the stored word into the natural binary code (or possibly a different code) prior to its transmission to a remote destination.

The above and other features of my invention will be described in detail hereinafter with reference to the accompanying drawing in which:

FIG. 1*a* is a graph of a compression characteristic of tyype used in a pulse-code modulator embodying my invention;

FIG. 1*b* is a graph showing part of the characteristic of FIG. 1*a* on a larger scale together with the corresponding multiplication factors;

FIG. 2 is a block diagram of a pulse-code modulator embodying my invention;

FIG. 3*a* shows details of a first analog/digital converter forming part of the embodiment of FIG. 2;

FIG. 3*b* shows further details of a comparator pair included in the converter of FIG. 3*a;*

FIG. 4*a* shows details of a second A/D converter forming part of the system of FIG. 2;

FIGS. 4*b* – 4*f* are graphs serving to explain the operation of the converter shown in FIG. 4*a;*

Figure 1A:
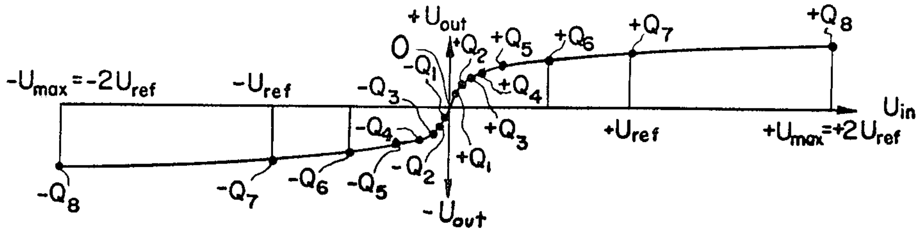

In FIG. 1*a* I have shown a compression characteristic of the type described above, representing the variation of the output voltage $U_{out}$ of an amplitude converter in response to different input voltages $U_{in}$ ranging between a negative limit $-U_{max}$ and a positive limit $+U_{max}$ of the same absolute magnitude. Also indicated in the graph is a reference voltage $U_{ref}$, with $U_{max} = 2U_{ref}$. The positive branch of the curve, lying in the first quadrant, and its negative branch, lying in the third quadrant, are mutually symmetrical about the origin O and are each subdivided at points $+Q_1$ to $+Q_8$ and $-Q_1$ to $-Q_8$ into $2^m$ linear segments, there being eight such segments ($m = 3$) in the example given. The first six segments of the positive branch have been shown more clearly in FIG. 1*b;* because of the symmetry, the subsequent discussion will be limited to this positive branch.

The seven knee point $Q_1 - Q_7$ of the curve are progressively spaced along the abscissa according to a binary law, with the exception of the first two points $Q_1$, $Q_2$ defining bands of like width (equal to $U_{ref}/64$) for the amplitude of input voltage $U_{in}$. Thus, width of the third band (between the points $Q_2$ and $Q_3$) is $U_{ref}/32$, that of the fourth band is $U_{ref}/16$, and so forth to a maximum value of $U_{ref}$ for the eighth band. The slopes of the several linear segments defined by these knee points decrease in the same binary ratio (being identical for the first two segments) so that the output voltage $U_{out}$ rises from one point to the next by a constant differential $\Delta U$. With the spread $\Delta U$ quantized in $2^n$ steps, as indicated along the ordinate in FIG. 1*b* for $n = 4$, the magnitude of $+U_{in}$ may be coded in $m+n= 7$ bits. An additional bit, ranking above the others, may be used to discriminate between positive and negative polarity so that the entire range between $-U_{max}$ and $+U_{max}$ can be covered by $m+n+l = 8$ bits.

Figure 1B:
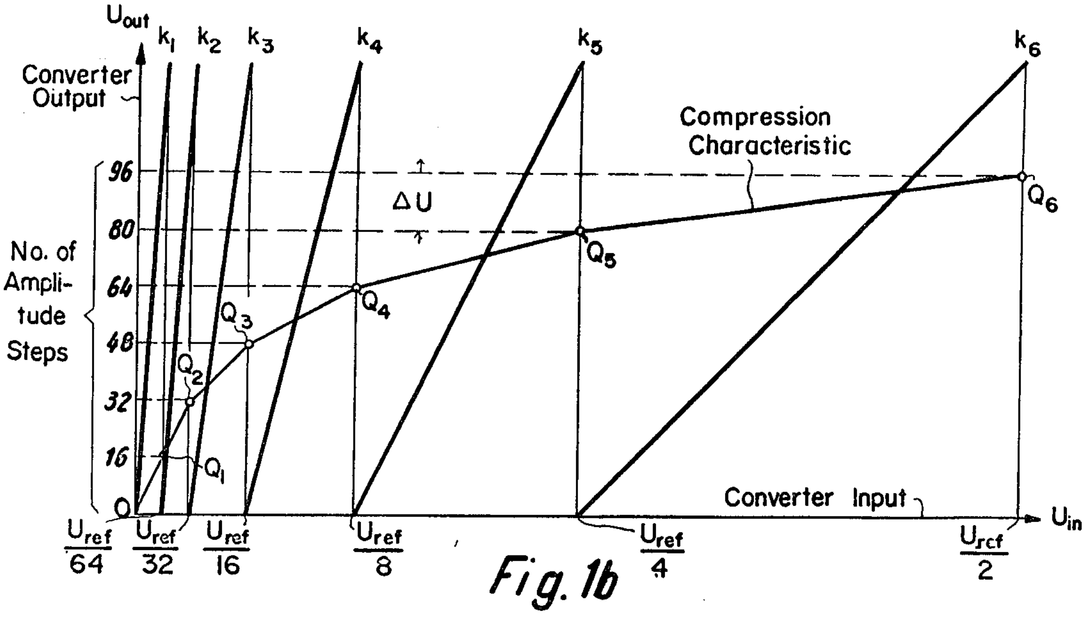

FIG. 1*b* also shows a series of straight lines $k_1 - k_6$ representing, by their slopes, the amplification ratio of an amplitude converter operating in the range between 0 and $U_{ref}/2$, the slopes of these lines being related to those of the corresponding curve segments by a suitable proportionality factor depending upon the step-down (or possibly step-up) ratios in other parts of the system. Since only the relative magnitudes of these slopes are significant, their absolute value could also be fractional so as to provide amplitude reduction rather than magnification. Again, the first two slopes $k_1$ and $k_2$ are identical as is necessary, because of the logarithmic character of the binary law, in order to extend the curve to the origin.

The width of each of the first two bands, equaling $U_{ref}/64$, may also be given as $U_{max}/128$ or, more generally, $U_{max}/2^{(2\ -1)}$.

Figure 2:
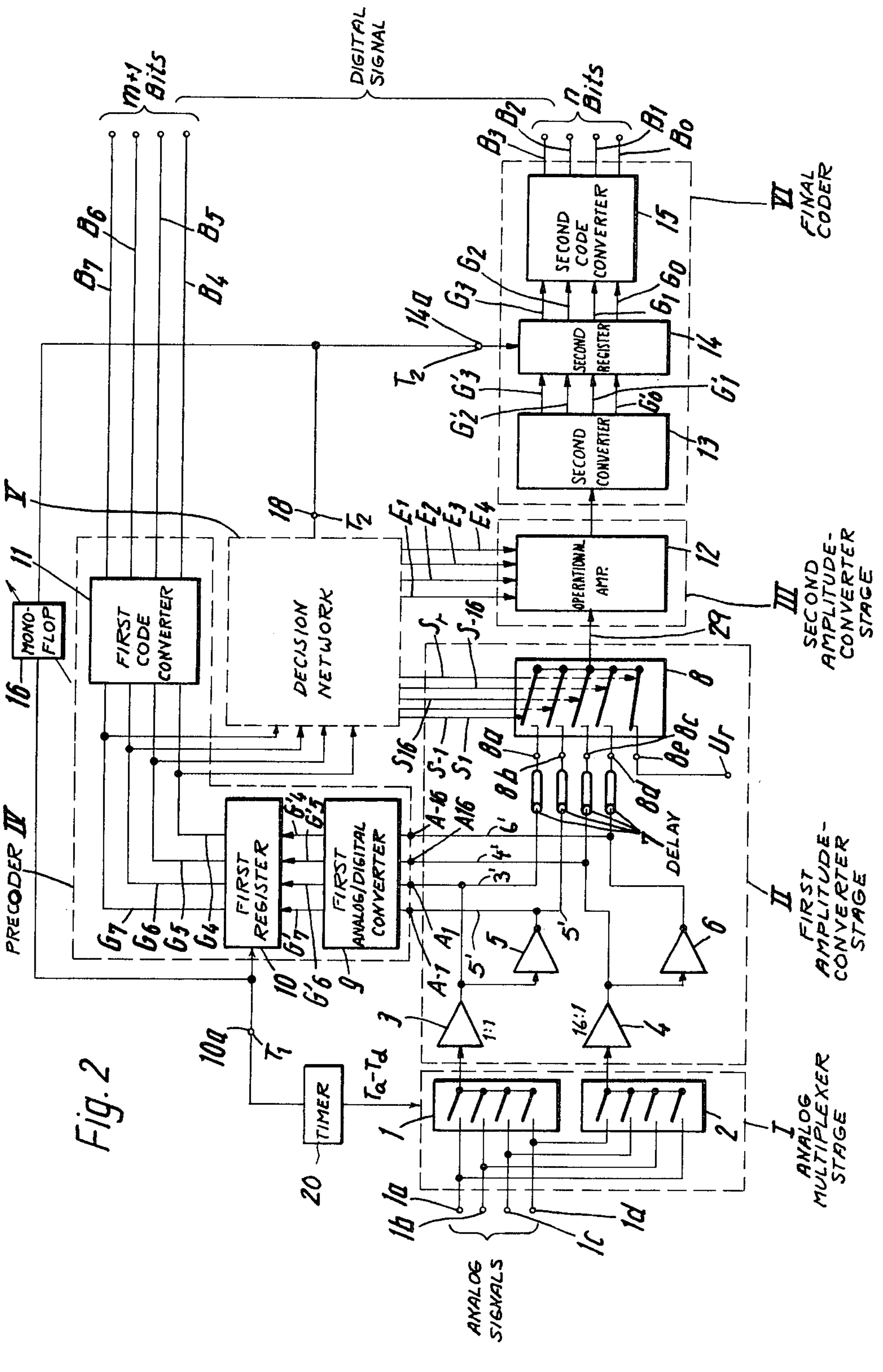

Reference will now be made to FIG. 2 which shows a pulse-code modulator with a compression characteristic as shown in FIGS. 1*a* and 1*b*. My improved modulator, however, may also work with a straight characteristic where all the segments have the same slope, e.g. for the transmission of television pictures or digital data.

The system shown in FIG. 2 includes an input stage I served by a multiplicity of incoming lines 1*a*, 1*b*, 1*c*, 1*d* which are sampled in cyclic succession, as is usual in PCM telecommunication, under the control of pulses $T_a$, $T_b$, $T_c$, $T_d$ from a timer 20 operating two sets of electronic switches in a pair of parallel analog multiplexers 1 and 2. These two multiplexers work into respective amplifiers 3 and 4 of a first amplification stage II, amplifier 3 having a relative low gain here assumed to be unity whereas amplifier 4 has a relatively high gain of 16:1. As more fully described hereinafter with reference to FIG. 11, high-gain amplifier 4 is provided with limiting or protective circuitry preventing its saturation in the presence of large signal amplitudes, this limiting circuitry including a voltage-responsive input resistance (constituted by two antiparallel diodes) which drops to a low value when the signal exceeds a predetermined threshold. If only a single set of switches common to both amplifiers were provided, this reduction in the input resistance of amplifier 4 would make the input signal of amplifier 3 susceptible to considerable fluctuations in the presence of possible variations (e.g. with changing temperatures) in the resistance of the analog multiplexer; the use of two separate multiplexers 1, 2 individual to amplifiers 3, 4 avoids this drawback by mutually decoupling the two amplifiers.

Amplitude-converter stage II has four output leads 3', 4', 5' and 6'. Amplifier 3 works directly into lead 3' and through an analog inverter 5 into lead 5'; similarly, amplifier 4 works directly into lead 4' and through an analog inverter 6 into lead 6'. Leads 3' - 6' supply respective signals $A_1$, $A_{-1}$, $A_{16}$ and $A_{-16}$ to four inputs of a first analog/digital converter 9 forming part of a precoder IV, the subscripts of these signals denoting the corresponding amplification factors. The leads 3' - 6' also extend, through individual delay lines 7, to respective contacts 8*a*, 8*b*, 8*c* and 8*d* of a selector switch 8 also having a fifth contact 8*e* connected to a source of respose potential $U_r$, preferably ground. Switch 8 is controlled by a decision network V via respective outputs $S_1$, $S_{-1}$, $S_{16}$, $S_{-16}$ and $S_r$ thereof, output $S_r$ being normally effective (in the absence of a transfer pulse $T_3$ applied to an input 18 of netowrk V) to close the bottom contact of the switch so as to apply the repose potential $U_r$ to an input 29 of a second amplitude-converter stage III consisting of a single operational amplifier 12. The illustrated contacts of switch 9 are, of course, representative of electronic switching devices, preferably field-effect transistors.

Precoder IV further includes a first binary register 10, of four parallel stages, loaded by the converter 9 via respective leads carrying bits $G'_4$, $G'_5$, $G'_6$ and $G'_7$ of the Gray code. Register 10 has an enabling input 10*a* to which a recurrent writing pulse $T_1$ is delivered by the timer 20. The four output leads of register 10 carry the stored bits, now designated $G_4 - G_7$, to a first code converter 11 translating them into bits $B_4 - B_7$ of the natural binary code. As already explained, the highest-ranking bit $G_7$ (or $B_7$) indicates the polarity of the signal voltage $U_{in}$ whereas the three other bits identify the eight amplitude bands defined by points $Q_1 - Q_8$ on either side of the origin in FIG. 1*a*. The bits $G_4 - G_7$, together with their complements $\overline{G_4} - \overline{G_7}$ (see FIG. 9), are also fed to network V which on the basis thereof energizes one of its outputs $S_1$, $S_{-1}$, $S_{16}$ and $S_{-16}$, controlling the switch 8, as well as a combination of outputs $E_1 - E_4$ controlling the gain of operational amplifier 12. Switch 8 thereupon delivers to amplifier 12 a modified replica $U'_{in}$ of the original analog voltage $U_{in}$.

Amplitude-converter stage III works into a final coder VI which includes a second analog/digital converter 13, a second binary register 13 and a second code converter 15. Register 14, which receives a writing pulse $T_2$ on an enabling input 14*a*, is loaded with Gray-code bits $G'_0$, $G'_1$, $G'_2$, $G'_3$ from A/D converter 13 and supplies corresponding bits $G_0 - G_3$ to converter 15 for translation into natural-code bits $B_0 - B_3$. Writing pulse $T_2$, derived from pulse $T_1$ through a preferably adjustable retarding device 16 such as a monoflop, is also fed as a transfer pulse to an input 18 of network V.

The relative time positions of sampling pulses $T_a$, $T_b$, $T_c$, $T_d$, writing pulses $T_1$, $T_2$ and inverted transfer pulse $\overline{T_2}$ (whose significance will be explained hereinafter) have been illustrated in FIG. 12. The mutual staggering of these pulses is dictated by the response times of the circuits concerned, such as the A/D converters 9, 13 and the registers 10, 14; the lag introduced by delay lines 7 balances the response time of network V as determined by the relative spacing of pulses $T_0$ and $T_3$. If the incoming signal is not expected to change significantly during this latter interval, delay lines 7 may be omitted. In any event, the bits generated by A/D converters 9 and 13 at the instants of activation of their respective output circuits are derived from the same instantaneous value of incoming signal voltage $U_{in}$.

It will be understood that code converters 11 and 15 may be omitted if a decoder at the far end of a transmission line served by the modulator of FIG. 2 is designed to work on the Gray code rather than on the natural binary code.

Incoming signals of relatively large amplitude of either polarity, falling into the eight outer segments of the characteristic of FIG. 1*a* defined by points $+Q_4$ through $+Q_8$ and $-Q_4$ through $-Q_8$, are transmitted unchanged (except for polarity inversion in the case of, say, negative voltages) to leads 3' and 5' by the amplifier 3 of amplification ratio 1:1. Low-amplitude signals falling into the eight inner segments (between points $+Q_4$ and $-Q_4$) are amplified 16 times in amplifier 4 before reaching the output leads 4' and 6', again with polarity inversion in the case of negative voltages. Negative voltages appearing on any of these leads are not processed and may be suppressed by nonillustrated diodes.

This amplification of low signal voltages increases the sensitivity of the system; on the other hand, though the amplifier 4 evidently receives also the larger voltages, these are rendered ineffectural by the overload-protection circuitry described hereinafter with reference to FIG. 11.

Details of the construction and operation of the principal components of the modulator shown in FIG. 2 will now be described with reference to subsequent Figures.

Figures 3A, 12:
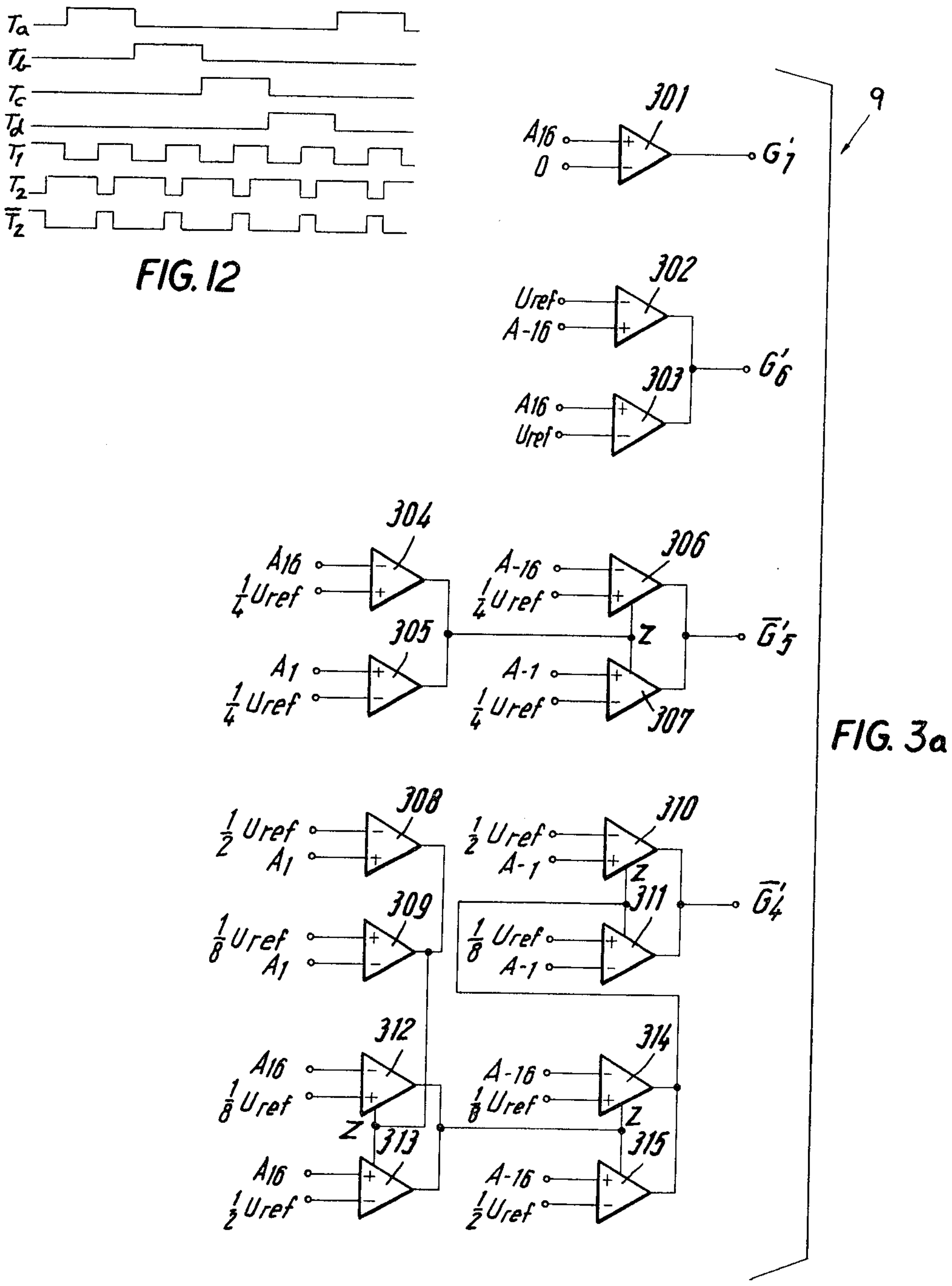
FIG. 12 is a set of graphs relating to the timing of the operations of the modulator.

FIG. 3*a* shows the A/D converter 9 which comprises a multiplicity of comparators 301 — 315, abut the first comparator 301 being combined into pairs. These comparator pairs have been represented in simplified form in FIG. 3*a* but actually have the construction illustrated in FIG 3*b* which shows two such comparators 31, 32 working through respective AND gates 33 and 34 into an OR gate 35. AND gates 33, 34 have additional inputs jointly energizable by an unblocking signal Z; mparator pairs shown in FIG. 3*a* without the "Z" input lack, of course, such AND gates and are directly connected to the asscociated OR gate.

In FIG. 3*a*, each comparator has an input connected to a fixed potential based upon reference voltage $U_{ref}$ whose magnitude, as discussed in conjunction with FIGS. 1*a* and 1, equals half the maximum signal voltage $U_{max}$; the other input of each comparator is connected to one of the leads 3' – 6' of FIG. 2 as indicated by the designations $A_1$, $A_{-1}$ and $A_{16}$, $A_{-16}$. In the case of comparator 301, the reference potential is zero; this comparator receives, as indicated at $A_{16}$, the input of amplifier 4 and therefore generates the sign bit $G'_7$ whenever this output is positive; otherwise, the negation $\overline{G'_1}$ is produced. For purposes of this sign bit, amplifier 4 is effective throughout the range of signal amplitudes.

Comparators 302 and 303 are energized from leads 4' and 6', respectively, matching the input signals $A_{-16}$ and $A_{16}$ with reference potential $U_{ref}$ to generate either the bit $G'_6$ or its negation $\overline{G'_6}$. Bit $G'_5$, in its inverted form $\overline{G'_5}$, is produced by two cascaded comparator pairs 304, 305 and 306, 307. One comparator of each pair, i.e. 304 and 306, matches the reference potential $U_{ref}/4$ with signal $A_{16}$ or $A_{-16}$, respectively; the other comparator (305, 307) does the same thing with regard to signal $A_1$ or $A_{-1}$. The second pair 306, 307 is enabled at input Z only if the comparison made by the first pair is true.

Bit $G'_0$, again in its inverted form $\overline{G'_0}$, is generated by the four remaining comparators 308 – 315 arrayed in four cascaded pairs. Comparators 308, 320, 313 and 314 match the reference potential $U_{ref}/2$ against signals $A_1$, $A_{-1}$, $A_{16}$ and $A_{-16}$, respectively; the other four comparators do the same thing with reference potential $U_{ref}/8$.

The operation of code converter 9 will be described in greater detail with reference to the analogously organized code converter 13 shown in FIG. 4*a* as comprising a set of comparators 401 – 415, all but the first comparator 401 being divided into pairs which in the case of comparator 404 – 415 are cascaded. Attention is also called to FIGS. 4*b* –4*f;* FIG. 4*b* shows a comparison voltage $U_{comp}$, ranging from zero to $U_{ref}$, plotted against modified signal voltage $U''_{in}$ derived from voltage $U'_{in}$ upon treatment in amplitude-converter stage III, whereas FIGS. 4*c* – 4*f* show the comparator outputs $G'_3$ , $\overline{G'_2}$, $\overline{G'_1}$ and $\overline{G'_0}$ plotted against the same signal amplitudes. In FIGS. 4*c* - 4*e* the comparators involved in the generation of the several bits have been indicated parenthetically alongside the respective graphs.

Bit $G'_3$ (FIG. 4*c*) appears in the output of comparator 401 whenever the signal amplitude $U''_{in}$ exceeds $U_{ref}/2$.

As indicated in FIG. 4*d*, comparator 402 has a true output "1" for signal voltages greater than $3U_{ref}/4$; comparator 403 responds to signal voltages less than $U_{ref}/4$ so that their combined output directly yields the inverted Gray-code bit $\overline{G}'_2$.

Comparators 406 and 407 conduct with $U''_{in} < U_{ref}/8$ and $U''_{in}$ $3U_{ref}/8$, respectively; comparator 407, however, is inhibited (as indicated in dotted lines) if the preceding comparator pair 404, 405 has no output. This is the case if signal voltage $U''_{in}$ is greater than $5U_{ref}/8$ but less than $7U_{ref}/8$. Thus, the final output derived from comparators 406 and 407 is the Gray-code bit $G'_1$.

Figures 3B, 4A:
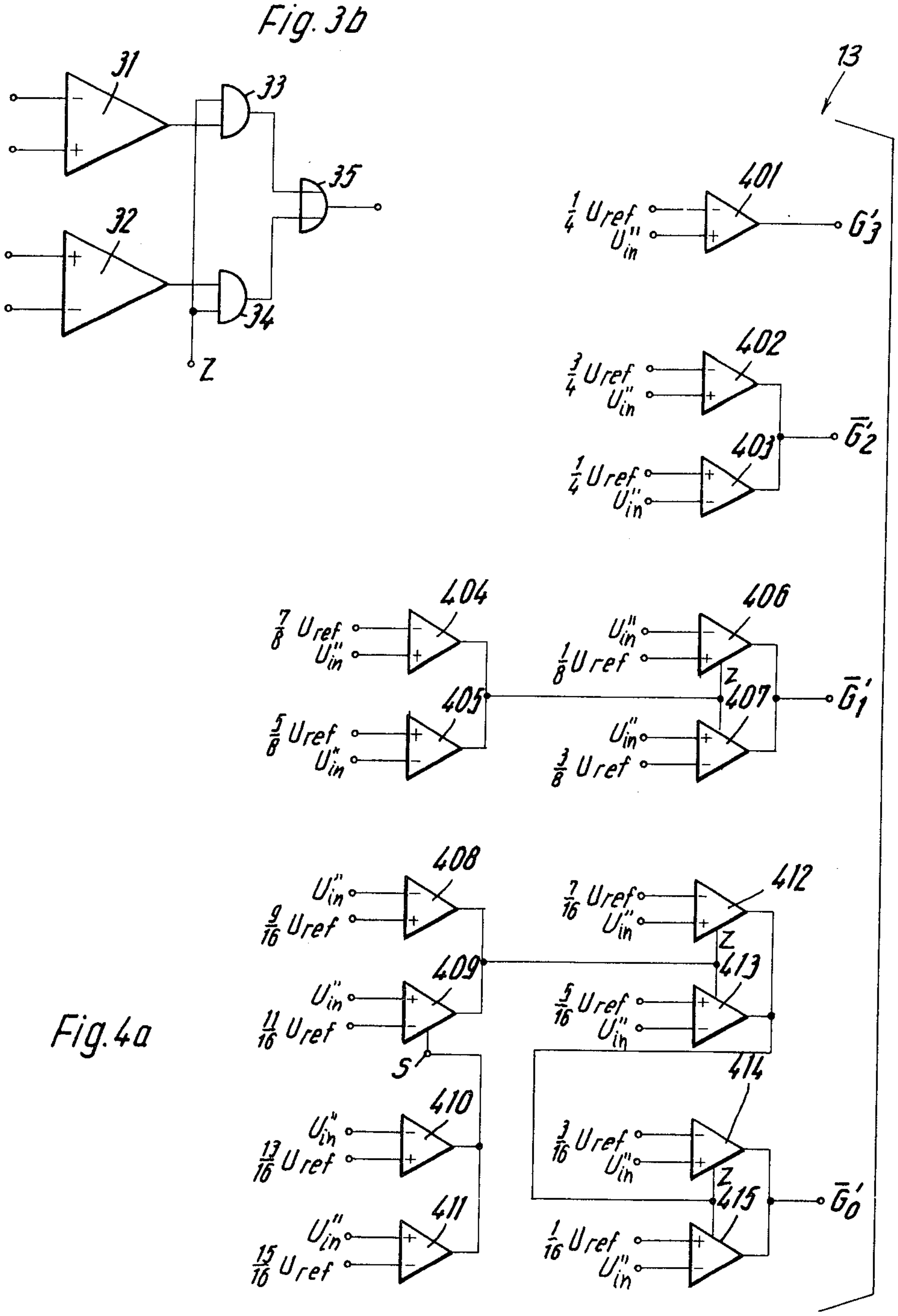
Figures 4B, 4C, 4D, 4E, 4F:
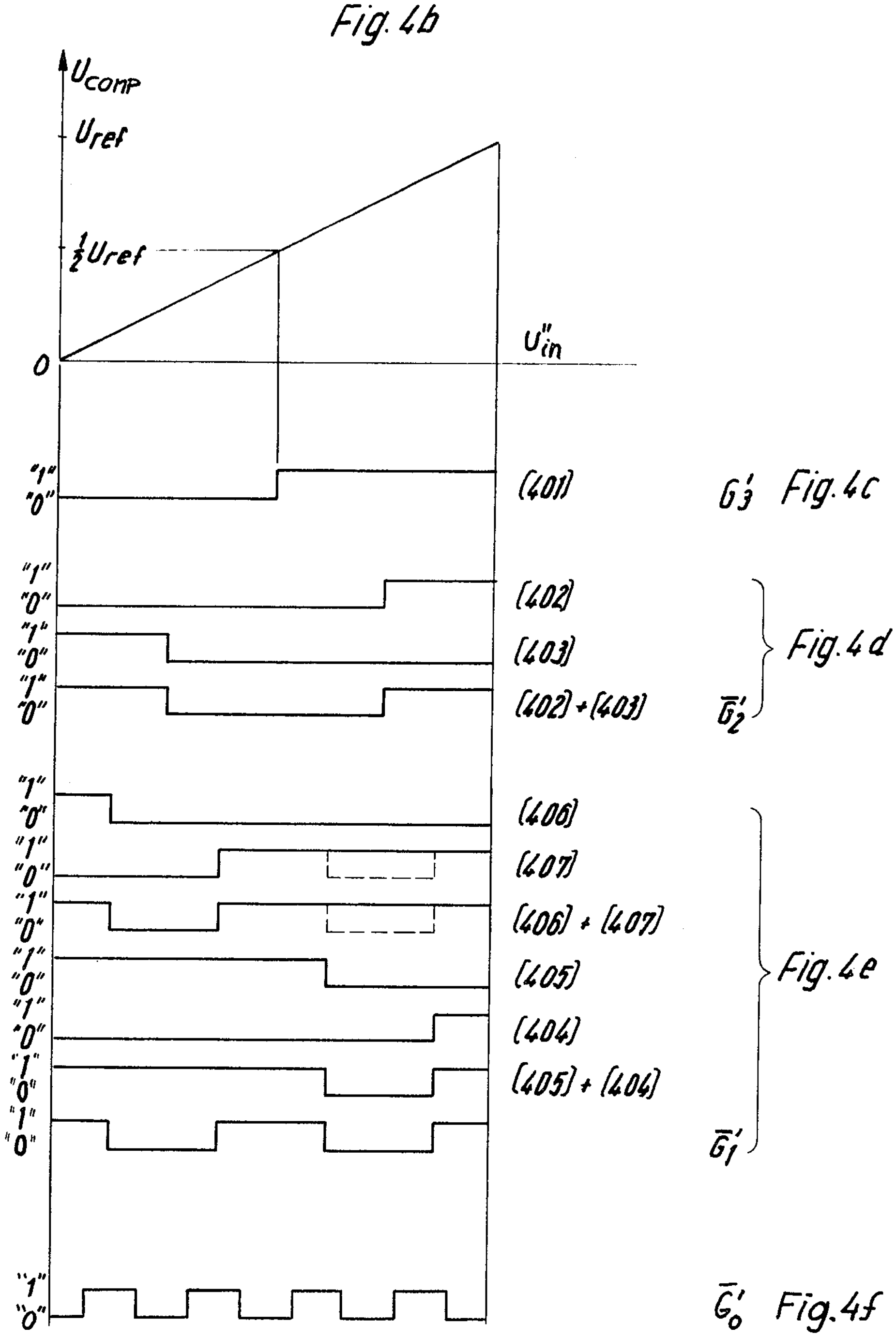

The synthesis of Gray-code bit $\overline{G}'_0$ has not been illustrated but will be readily traceable from the connections shown in FIG. 4*a* which indicate that comparators 408, 410, 413 and 415 receive on their additive inputs the reference potentials $9U_{ref}/16$, $13U_{ref}/16$, $5U_{ref}/16$ and $U_{ref}/16$, respectively, whereas comparators 409, 411, 413 and 415 are energized on their subtractive inputs with respective reference potentials $11U_{ref}/16$, $15U_{ref}/16$, $7U_{ref}/16$ and $3U_{ref}/16$.

The reference potentials for these comparators (as well as for those of FIG. 3*a*) can be derived in a simple manner from a common voltage divider as disclosed in my prior applikcation and patent identified above.

Figure 5:
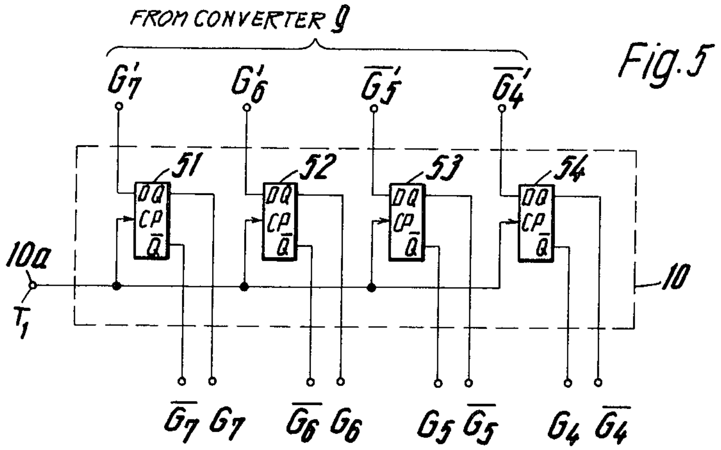
FIGS. 5 and 6 are circuit diagrams showing details of a first and a second binary register included in the system of FIG. 2.

In FIG. 5 I have shown details of the first register 10 receiving the four highest-ranking Gray-code bits $G'_4$ – $G'_7$ (paly in (partly inverted form) produced by converter 9 as described with reference to FIG. 3*a*. These bits are fed to the setting inputs D of all four flip-flops 51 –54 also having control inputs OP all connected to terminal 10$a$ for energization by the writing pulse $T_1$ from timer 20. These flip-flops are switchable only upon the energization of their control inputs and therefore retain their previous settings until the arrival of pulse $T_1$. The set outputs Q of flip-flops 51, 52, 53 and 54 reproduce, as bits $G_7$, $G_6$, $\overline{G_5}$ and $\overline{G_4}$, the bits $G'_7$, $G'_6$, $\overline{G'_5}$ and $\overline{G'_4}$ applied to their setting inputs D; their reset outputs $\overline{Q}$ carry the respective complements $\overline{G_7}$, $\overline{G_6}$, $G_5$ and $G_4$.

Figure 6:
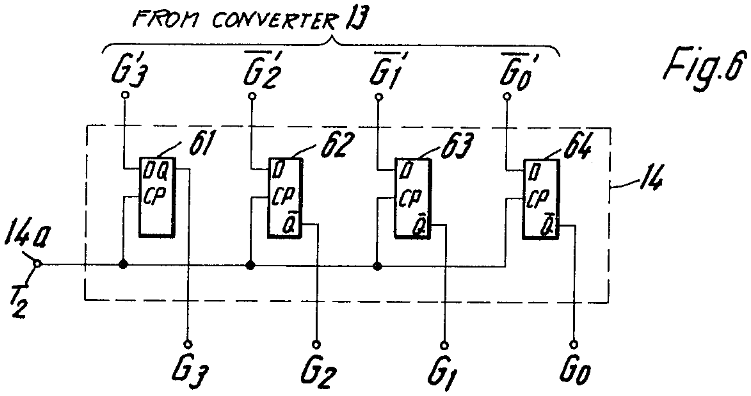

The second register 14, shown in FIG. 6, is of the same four-stage construction with flip-flops 61 – respectively receiving the four lowest-ranking Gray-code bits $G'_0$ – $G'_3$, partly in inverted form, from converter 13 as illustrated in FIG. 4$a$; their control inputs CP are all connected to terminal 14$a$ which is periodically energized by writing pulse $T_2$. Since the complements of these bits are not needed in the system under discussion, only the set output Q of flip-flop 64 and the reset outputs $\overline{Q}$ of flip-flops 62 – 64 are used to generate the bits $G_3$, $G_2$, $G_1$, $G_0$ from bits $G'_3$, $\overline{G'_2}$, $\overline{G'_1}$ and $\overline{G'_0}$, respectively.

Figure 7:
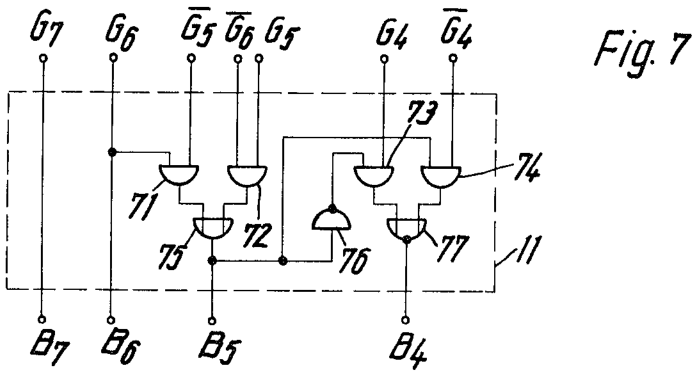
FIGS. 7 and 8 are circuit diagrams showing details of a first and a second code converter included in the system of FIG. 2.

The first code converter 11 has been shown in FIG. 7 as comprisng four AND gates 71 – 74, a pair of OR gates 75, 77 and an inverter 76. The bits $G_6$ and $G_7$ are directly reproduced as bits $B_6$ and $B_7$, respectively. AND gates 71 and 72, working into OR gate 75, respectively receive bits $G_6$, $\overline{G_5}$ and $\overline{G_6}$, $G_5$, so that bit $B_5$ in the output of OR gate 75 n be expressed by the Boolean equation:

$$B_5 = (G_6 \,.\, \overline{G_5}) + (\overline{G_6} \,.\, G_5).$$

Bit B is transmitted directly to an input of AND gate 74 and via inverter 76 to an input of AND gate 73 also receiving the bits $G_4$ and $G_4$, respectively. Thus, the bit $B_4$ emerging from OR gate 77 in the output of these two AND gates can be expressed by the Boolean equation:

$$B_4 = (B_5 \,.\, \overline{G_4}) + (B_5 \,.\, \overline{G_4}).$$

Figure 8:
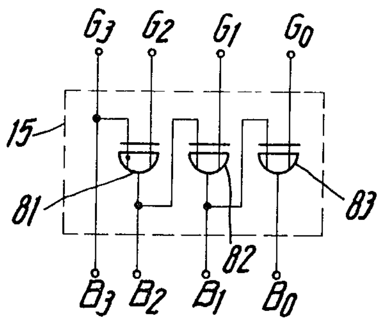

The second code converter 15 has been illustrated in FIG. 8. Again, the highest-ranking bit $G_3$ is translated directly into its counterpart $B_3$. Three Exclusive-OR (also known as Circle-OR or "Antivalence") gates 81, 82 and 83 respectively receive the three lowest-ranking Gray-code bits $G_2$, $G_1$ and $G_0$ together with the immediately higher ranking natural -code bits $B_3$, $B_2$ and $B_1$. Thus, bits $B_2$, $B_1$ and $B_0$ in the outputs of these Exclusive-OR gates may be expressed by the following Boolean equations:

$$B_2 = (G_3 \,.\, \overline{G_2}) + (\overline{G_3} \,.\, G_2)$$

$$B_1 = (B_2 \,.\, \overline{G_1}) + (\overline{B_2} \,.\, G_1)$$

$$B_0 = (B_1 \,.\, \overline{G_0}) + (\overline{B_1} \,.\, G_0)\ .$$

I shall now describe the logical circuitry of the decision network V (FIG. 9) generating the outputs $S_r$, $S_1$, $S_{-1}$, $S_{16}$ and and $S_{-16}$ for selector switch 8 and the outputs $E_1$ –$E_4$ for amplifier stage III. The bits $G_4$ – $G_7$ and their complements $\overline{G_4}$ – $\overline{G_7}$, received from register 10, are distributed to several NAND gates 95 – 98 and 101 – 103 as well as a pair of AND gates 99 and 100 feeding a further NAND gate 105 through a NOR gate 104; gates 95 – 98 work into respective NOR gates 91 – 94 also receiving the inverted transfer pulse $\overline{T_2}$ on an output lead 18'' of monoflop 16 whose output 18' carries the pulse $T_2$. (Leads 18', 18'' have been collectively designated 18 in FIG. 2). Output $S_r$ is connected directly to lead 18''; outputs $S_1$, $S_{-1}$, $S_{-16}$ are respectively energized by NOR gates 91 and 94. NAND gate 103, with inputs connected to lead 18' and to the output of NAND gate 101, works into the output $E_1$. OR gate 104 energizes the output $E_3$ through an inverter 106 and also energizes the output $E_2$, in the presence of bit $\overline{G_4}$, through NAND gate 105. Output $E_4$ is connected to a NOR gate 107 receiving the bit $G_4$ together with the output of NAND gate 102.

The operation of network V may be represented by the following Boolean equations:

$$S_r = \overline{T_2}$$

$$S_1 = G_6 \,.\, G_7 \,.\, \overline{T_2}$$

$$S_{-1} = G_6 \,.\, \overline{G_7} \,.\, T_2$$

$$S_{16} = \overline{G_6} \,.\, G_7 \,.\, T_2$$

$$S_{-16} = \overline{G_6} \,.\, \overline{G_7} \,.\, T_2$$

$$E_1 = (\overline{G_4} \,.\, \overline{G_5} \,.\, \overline{G_6}) + \overline{T_2}$$

$$E_2 = G_4 + (G_5 \,.\, G\ 6) + (\overline{G_5} \,.\, \overline{G_6})$$

$$E_3 = (G_5 \,.\, G_6) + (\overline{G_5}\ \overline{G_6})$$

$$E_4 = (\overline{G}_4 \,.\, G_5 \,.\, G_6)$$

Figure 10:
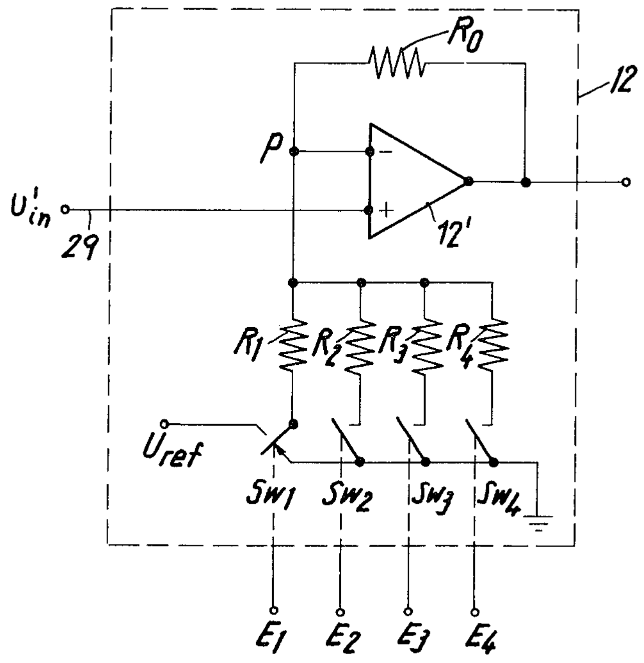
FIG. 10 shows details of a second amplifier stage included in the modulator.

FIG. 10 shows a suitable circuit arrangement for the operational amplifier 12 comprising an amplifying element 12'. The noninverting input of this amplifying element is connected to lead 29 carrying, in the operating condition of switch 8, either the repose potential $U_r$ or the signal voltage $U'_{in}$ as modified by the first amplifier stage II. The inverting input of amplifying element 12' is connected to a junction point P of a voltage divider consisting of a feedback resister $R_0$, connected in the usual manner to the amplifier output, and four parallel resistive branches $R_1$ – $R_4$ in series with respective switches $Sw_1$ – $Sw_4$. Switch $Sw_1$ grounds the resistor $R_1$ in one position (in the presence of signal $E_1$) and connects it to a fixed biasing potential $U_{ref}$ in the alternate position; the other three switches $Sw_2$ – $Sw_4$ ground their associated resistors $R_2$ – $R_4$ in the presence of signals $E_2$ – $E_4$ respectively. Resistrors $R_2$ – $R_4$ are of progressively decreasing magnitude, with $R_1 = R_0$, $R_2 = R_0/2$, $R_3 = R_0/4$ and $R_4 = R_0/8$.

As explained in my above-identified prior application and patent, the gain of amplifier 12 is given as $$(R_s - R_0 \,/\, R_s$$

where $R_s$ is the effective shunt resistance represented by the sum of the conductances of all the branches of matrix $R_1$ – $R_4$ connected in circuit. With switches $Sw\ 2$, $Sw_3$ and $Sw_4$ closed in the presence of signals $E_2$, $E_3$ and $E_4$ the amplification factor is 16; simultaneous closure of switches $Sw_2$ and $Sw_3$ by signals $E_2$ and $E_3$ yields an amplification factor of 8, whereas closure of switch $Sw_2$ alone makes this factor equal to 4. With switches $Sw_2$ – $Sw_4$ all open in the absence of signals $E_2$ – $E_4$, the amplification factor or gain is 2. The position of switch $Sw_1$ does not influence the gain but subtracts a voltage proportional to reference voltage $U_{ref}$ from the output voltage in all instances in which this is desired, i.e. for all signal amplitudes falling outside the two innermost segments defined by points $-Q_1$ and $+Q_1$.

The following table shows the amplitude band as determined by the absolute magnitude of the input voltage $U_{in}$, the corresponding Gray code (bits $G_6$, $G_5$ and $G_4$), the applicable amplification factor of stage II, the applicable amplification of stage III, and the energized inputs $E_1 - E_4$ playing a part in the latter amplification in accordance with the foregoing Boolean equations.

| Band No. | $G_6G_5G_4$ | Amplification 1st Stage | Factor 2nd Stage | Switching Signals |
|---|---|---|---|---|
| 1 | 0 0 0 | 16 | 8 | $E_1$, $E_2$, $E_3$ |
| 2 | 0 0 1 | 16 | 8 | $E_2$, $E_3$, |
| 3 | 0 1 1 | 16 | 4 | $E_2$ |
| 4 | 0 1 0 | 16 | 2 | — |
| 5 | 1 1 0 | 1 | 16 | $E_2$, $E_3$, $E_4$ |
| 6 | 1 1 1 | 1 | 8 | $E_2$, $E_3$, |
| 7 | 1 0 1 | 1 | 4 | $E_2$ |
| 8 | 1 0 0 | 1 | 2 | — |

It will thus be seen that the signal voltages in the lowermost amplitude band, ragg between zero and $U_{max}/128$, are amplified 128 times whereas those in the uppermost band, ringing from U max/ 2 to $U_{max}$, are amplified only twice but that, because of the subtraction of $U_{ref} = U_{max}/2$ in the input of amplifier 12, the swing of the output voltage is the same in both bands; a like voltage swing is also obtained for all the intermediate amplitude bands.

Switches $Sw_1 - Sw_4$ are, of course, also realized in practice by transistors (e.g. FET's) controlled by the signals $E_1 - E_4$.

As will further be apparent from the foregoing Boolean equations, signal $E_1$ is present both in the absence of transfer pulse $T_3$ and in the presence of such pulse if the input signal falls into the lowermost amplitude band, i.e. if bits $G_4$, $G_5$ and $G_6$ are all "0." Under these circumstances, therefore, resistor $R_1$ is disconnected from its biasing source $U_{ref}$.

Figure 11:
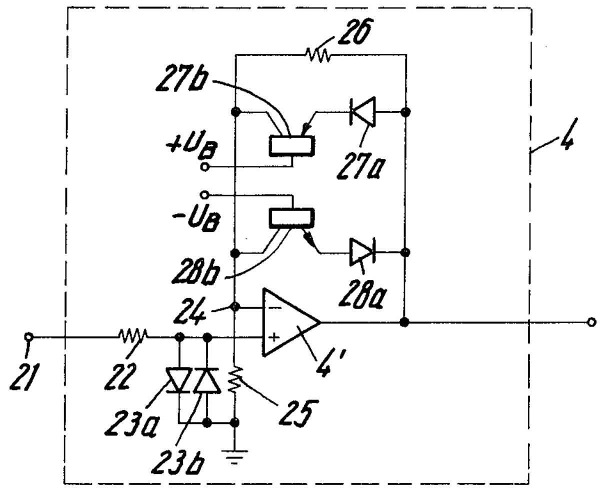
FIG. 11 shows details of one of two parallel amplifiers included in a first amplifier stage of the modulator.

The high-gain amplifier 4 of FIG. 2 has been illustrated in some detail in FIG. 11 which shows an amplifying element 4'. with its noninverting input connected to a signal terminal 21 through a resistor 22 and its inverting input tied to a tap 24 of a voltage divider comprising resistors 25 and 26 connected between the amplifier output and ground. Grounded resistor 25 has two antiparallel diodes **23*a* and 23*b* which break down as soon as the input voltage exceeds a certain threshold established by resistor 22; in the system under consideration the absolute magnitude of this threshold may be just above the knee point $Q_4$ of FIGS. 1*a* and 1*b*. Resistor 26 is shunted by two complementary transistors 27*b* (PNP) and 28*b* (NPN) in series with respective diodes 27*a* and 28*a* conductingly inserted in their emitter leads; the bases of these transistors are energized by two biasing potentials $+U_B$ and $-U_B$ which may lie just above $+U_{ref}/8$ and below $-U_{ref}/8$ respectively, and keep the transistors cut off with low input voltages. Amplifying element 4', which has a bipolar output, thus operates linearly within the limits established by the protective diodes 23*a*, 23*b* in its input and by the protective transistors 27*b* 28*b* in its output, i.e. within its assigned eight segments of the compression characteristic of FIGS. 1*a* and 1*b***; larger output voltages result in conduction of either one or the other transistor so that the negative feedback is increased with corresponding reduction in the gain of the amplifier. Overdriving and saturation of this amplifier is thereby effectively prevented so that the amplifier can respond virtually ilmmediately to any signal voltage falling within its operating range.

Figure 9:
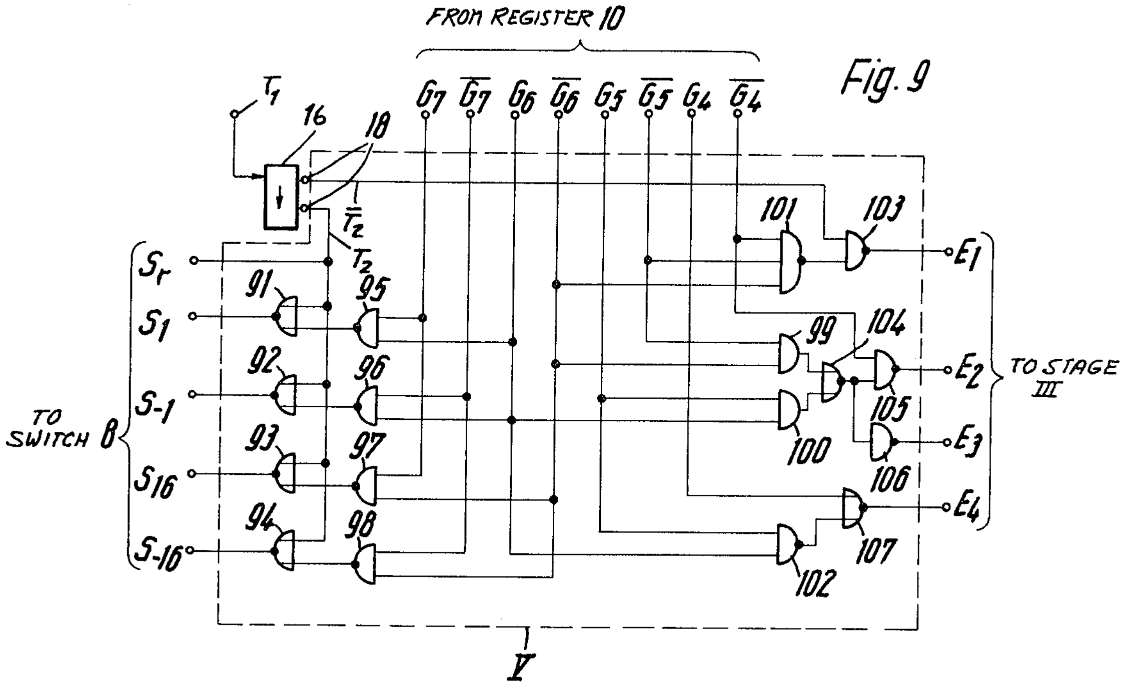
FIG. 9 shows details of a decision network forming part of the modulator of FIG. 2.

From FIG. 9 it will be apparent that outputs $S_{16}$ and $S_{-16}$, causing the extension of lead 4' or 6' to amplifier stage 12 (depending on whether the sign bit $G_7$ is present or not), are generated only if bit $G_6$ is absent, i.e. if the absolute magnitude of the input signal falls within the operating range of amplifier 4. Thus, the nonlinear output delivered by this amplifier in the case of higher absolute amplitude values has no effect upon the remainder of the system.

The high-rate response insured by the protective circuitry of FIG. 11 enables the use of my improved modulator not only for voice transmission but also for pulse-coded high-frequency messages such as radio and television programs.

I claim:

1. A pulse-code modulator for signal voltages within a predetermined amplitude range divided into at least $2^m$ bands, comprising:

input means for supplying a signal voltage to be coded;

variable-gain amplifying means including a first amplifier stage and a second amplifier stage in cascade with each other, said first amplifier stage being connected to said input means for compressing the range of said signal voltage;

a precoder connected, ahead of said second amplifier stage, to the output of said first amplifier stage for receiving therefrom information on the magnitude of said signal voltage, said precoder including a first analog/digital converter and an *m*-bit register in the output of said first converter temporarily storing a first partial code of *m* bits for identifying the amplitude band of said signal voltage, *m* being an integer greater than 0;

a decision network connected to said *m*-bit register for receiving said first partial code therefrom and separately controlling the gain of both amplifier stages of said amplifying means in response thereto with generation of an output voltage rising linearly from zero within each band;

a final code connected to the output of said second amplifier stage, said final coder including a second analog/digital converter for translating said output voltage into a second partial code of *n-bits*, *n* being an integer greater than 0; and timer means generating a recurrent wring pulse for said m-bit register, thereby enabling same to store said first partial code, said final coder being provided with an output circuit connected to said timer means for recurrent activation at the frequency of the writing pulses.

2. A modulator as defined in claim 1 wherein said first amplifier stage is provided with a plurality of output leads and with switch means controlled by said decision network for selectively extending any one of said output leads to said second amplifier stage.

3. A modulator as defined in claim 2 wherein said output circuit includes an *n*-bit register.

4. A modulator as defined in claim 3 wherein said timer means generates a train of first writing pulses for said *M*-bit register and a train of second writing pulses for said *n*-bit register staggered with reference to said first writing pulses to compensate for the transit time of the signal voltage between said amplifier stages.

5. A modulator as defined in claim 4, further comprising ancillary delay means in said output leads compensating for the response time of said decision network.

6. A modulator as defined in claim 2 wherein said switch means is normally operative to apply a repose potential of predetermined value to said second amplifier stage, said decision network being responsive to a recurrent transfer pulse from said timer means for controlling said switch means to replace said repose potential by the voltage of a selected output lead for an interval of fixed duration following each writing pulse.

7. A modulator as defined in claim 2 wherein said first amplifier stage comprises a low-gain amplifier and a high-gain amplifier in parallel with each other, each of said amplifiers working into a respective output lead terminating at said switch means.

8. A modulator as defined in claim 7 wherein the signal voltage to be coded can have either of two polarities, said first amplifier stage further including a pair of inverters respectively connected to the outputs of said amplifiers and working into two other output leads terminating at said switch means.

9. A modulator as defined in claim 8 wherein said precoder has an input connected to said output leads ahead of said switch means, said *m*-bit register including an additional stage for the entry of a sign bit indicating the polarity of said signal voltage.

10. A modulator as defined in claim 7 wherein said high-gain amplifier is provided with protective circuitry preventing saturation thereof.

11. A modulator as defined in claim 10 wherein said high-gain amplifier has a negative-feedback path, said protective circuitry including a series resistance in said path and an electronic switch normally biased to cutoff in shunt with said series resistance.

12. A modulator as defined in claim 10 wherein said protective circuitry comprises a pair of antiparallel shunt diodes in the input of said high-gain amplifier.

13. A modulator as defined in claim 7 wherein said input means comprises a plurality of incoming channels carrying respective signal voltages and multiplexing means controlled by said timer means for cyclically sampling said channels, said multiplexing means including a pair of parallel multiplexers respectively working into said amplifiers.

14. A modulator as defined in claim 1 wherein at least said first converter is operative to generate a reflected binary code.

15. A modulator as defined in claim 14, further comprising code-conversion means fed by said m-bit register for translating said first partial code from said reflected binary code into a natural binary code.

16. A modulator as defined in claim 14 wherein at least said first converter comprises a plurality of cascaded comparator pairs.

17. A modulator as defined in claim 1 wherein said secomd amplifier comprises an operational amplifier of adjustable gain controlled by said decision network.

18. A modulator as defined in claim 17 wherein said operational amplifier is provided with a feedback circuit including a resistance matrix and electronic switches for selectively disconnecting portions of said matrix.

19. A modulator as defined in claim 1 wherein said output circuit includes an *n*-bit register, further comprising retarding means connected to said timer means for deriving from the writing pulse for said *m*-bit register a delayed writing pulse for said *n*-bit register.

20. A modulator as defined in claim 19, further comprising normally open switch means between said amplifier stages controlled by said decision network and pulse-forming means connected to said retarding means for deriving from said delayed writing pulse a transfer pulse of predetermined duration fed to said decision network for closing said switch means.

* * * * *